(12) United States Patent
Goela et al.

(10) Patent No.: US 7,589,025 B2
(45) Date of Patent: Sep. 15, 2009

(54) SEMICONDUCTOR PROCESSING

(75) Inventors: Jitendra S. Goela, Andover, MA (US); Nathaniel E. Brese, Farmingdale, NY (US); Michael A. Pickering, Dracut, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 279 days.

(21) Appl. No.: 11/607,632

(22) Filed: Dec. 1, 2006

(65) Prior Publication Data

US 2007/0128837 A1 Jun. 7, 2007

Related U.S. Application Data

(60) Provisional application No. 60/742,221, filed on Dec. 2, 2005.

(51) Int. Cl.
*H01L 21/4763* (2006.01)
(52) U.S. Cl. .............. 438/708; 438/712; 257/E23.008; 257/E23.006; 257/E23.111
(58) Field of Classification Search ............... 438/708, 438/712; 257/E23.006, E23.008, E23.111
See application file for complete search history.

(56) References Cited

U.S. PATENT DOCUMENTS

| | | | | |
|---|---|---|---|---|
| 4,783,368 A | * | 11/1988 | Yamamoto et al. | 428/408 |
| 4,906,530 A | * | 3/1990 | Nishiike et al. | 428/614 |
| 4,963,393 A | | 10/1990 | Goela et al. | |
| 4,990,374 A | | 2/1991 | Keeley | |
| 4,997,678 A | | 3/1991 | Taylor et al. | |
| 5,071,596 A | | 12/1991 | Goela et al. | |
| 5,108,729 A | * | 4/1992 | Gerhold et al. | 423/346 |
| 5,179,049 A | | 1/1993 | Numata et al. | |
| 5,354,580 A | | 10/1994 | Goela et al. | |
| 5,374,412 A | | 12/1994 | Pickering et al. | |
| 5,407,750 A | * | 4/1995 | Kinoshita et al. | 428/450 |
| 5,456,796 A | | 10/1995 | Gupta et al. | |
| 5,848,120 A | * | 12/1998 | Shoki et al. | 378/35 |
| 6,086,680 A | | 7/2000 | Foster et al. | |
| 6,214,107 B1 | | 4/2001 | Kitabatake | |
| 6,300,226 B1 | | 10/2001 | Miyata et al. | |
| 6,387,466 B1 | * | 5/2002 | Fusegawa et al. | 428/64.1 |
| 6,454,865 B1 | | 9/2002 | Goodman et al. | |
| 6,454,866 B1 | | 9/2002 | Halpin et al. | |
| 6,464,843 B1 | | 10/2002 | Wicker et al. | |
| 6,608,287 B2 | | 8/2003 | Halpin et al. | |
| 6,626,526 B2 | * | 9/2003 | Ueki et al. | 347/72 |
| 6,692,576 B2 | | 2/2004 | Halpin et al. | |
| 6,780,787 B2 | | 8/2004 | O'Donnell | |
| 6,890,861 B1 | | 5/2005 | Bosch | |
| 6,893,507 B2 | | 5/2005 | Goodman et al. | |
| 2003/0075109 A1 | | 4/2003 | Arai | |
| 2003/0190870 A1 | | 10/2003 | Shih et al. | |
| 2004/0040632 A1 | | 3/2004 | Oosterlaken | |
| 2005/0181617 A1 | | 8/2005 | Bosch | |
| 2006/0255012 A1 | | 11/2006 | Jacobson et al. | |

FOREIGN PATENT DOCUMENTS

| | | | |
|---|---|---|---|
| JP | 05238855 A | * | 9/1993 |
| WO | WO 02/03427 | | 1/2002 |
| WO | WO 2005/099388 | | 10/2005 |

OTHER PUBLICATIONS

European Search Report of corresponding European Patent Application No. EP 06 25 6165.

* cited by examiner

*Primary Examiner*—Michael S Lebentritt
(74) *Attorney, Agent, or Firm*—John J. Piskorski

(57) ABSTRACT

Methods are disclosed for providing reduced particle generating silicon carbide. The silicon carbide articles may be used as component parts in apparatus used to process semiconductor wafers. The reduced particle generation during semiconductor processing reduces contamination on semiconductor wafers thus increasing their yield.

7 Claims, No Drawings

SEMICONDUCTOR PROCESSING

The present invention is directed to semiconductor wafer processing to provide semiconductor wafers having reduced particle contamination. More specifically, the present invention is directed to semiconductor wafer processing to provide semiconductor wafers having reduced particle contamination using reduced particle generating silicon carbide and methods of making the silicon carbide.

Many manufacturing steps are involved in the production of semiconductor wafers. One of the processing steps is the treatment of silicon wafers in the plasma etch chambers where fluorine based compounds such as $NF_3$ are used. Such compounds are very reactive and corrosive. In plasma etch chambers ceramic materials such as silicon carbide components are used because silicon carbide is a theoretically dense, high purity, high temperature material which is thermally compatible with silicon wafers and has high resistance to etching chemicals.

However, use of silicon carbide components such as gas diffusion plates in etch chambers generate large numbers of undesirable particulates which contaminate semiconductor wafers. Silicon carbide is machined with diamond tooling to produce components of specific shapes and sizes. The machining causes sub-surface damage such as crevices and caverns on the components. Loose silicon carbide particles become entrapped in the crevices and caverns. During etching the particulates are released from the components and contaminate the wafers. As more and more wafers are processed the particle density decreases. After 200 to 250 wafers are processed the particle generation from the components reduces significantly, and the silicon carbide component becomes acceptable for commercial wafer processing. Wasting 200 to 250 wafers each time a new silicon carbide component is conditioned is both expensive and inefficient for the industry where speed, cost and performance are emphasized.

U.S. Pat. No. 5,179,049 to Numata et al. discloses silicon carbide parts for heat treating apparatuses for semiconductors. The silicon carbide is mainly α-type silicon carbide with crystals not larger than 44 microns and low iron impurities. The α-type silicon carbide parts allegedly reduce contamination and increase the yield of semiconductor wafers during heat treatment.

Although there is an α-type silicon carbide which may reduce wafer contamination, there is still a need for a silicon carbide which reduces wafer contamination and may be used in various types of semiconductor processing chambers, and methods of making the silicon carbide.

In one aspect a method includes: a) providing a silicon carbide article; and b) modifying one or more surfaces of the silicon carbide article such that the article generates 160 particles/$dm^2$ or less on one or more semiconductor wafers during semiconductor wafer processing.

In another aspect a method includes: a) providing a silicon carbide article; and b) oxidizing one or more surfaces of the silicon carbide article such that the silicon carbide article generates 160 particles/$dm^2$ or less on one or more semiconductor wafers during semiconductor wafer processing.

In a further aspect a method includes: a) providing a silicon carbide article; b) oxidizing one or more surfaces of the silicon carbide article; and c) stripping the coating off of the one or more surfaces of the silicon carbide article such that the silicon carbide article generates 160 particles/$dm^2$ or less on one or more semiconductor wafers during semiconductor wafer processing.

The silicon carbide articles made by the methods may be used as components in semiconductor processing chambers. The silicon carbide articles reduce contamination of semiconductor wafers during processing in contrast to many conventional silicon carbide components, and provide for more efficient semiconductor wafer manufacturing processes.

As used throughout this specification, the following abbreviations shall have the following meanings, unless the context indicates otherwise: ° C.=degrees Centigrade; μm=microns=micrometers; m=meters; cm=centimeter; mm=millimeters; nm=nanometers; $dm^2$=square decimeters; A=amperes; mA=milliamperes; CVD=chemical vapor deposition; PVD=physical vapor deposition; ml=milliliters; min=minute; sec=second; msec=millisecond; hr=hour; Hz=hertz; kHz=kilohertz; W=watt=1 joule/second; erg=1 dyne cm=$10^{-7}$ Joules; mV=millivolts; 1 atmosphere=760 torr; 1 atmosphere=$1.01325 \times 10^6$ dynes/$cm^2$; psi=pounds per square inch; 1 atmosphere=14.7 psi; slpm=standard liters per minute as measured at atmospheric pressure and 20° C.; rpm=revolutions per minute; Å=angstroms=$1 \times 10^{-4}$ microns; RMS=root mean square; and SEM=scanning electron microscopy.

All percentages are by weight unless otherwise noted. All numerical ranges are inclusive and combinable in any order, except where it is logical that such numerical ranges are constrained to add up to 100%.

Methods include modifying one or more surfaces of silicon carbide articles such that the silicon carbide articles generate 160 particles/$dm^2$ or less on semiconductor wafers during semiconductor wafer processing. Typically, the silicon carbide articles generate 65 particles/$dm^2$ or less on semiconductor wafers during semiconductor wafer processing, or such as 30 particles/$dm^2$ or less on semiconductor wafers during semiconductor processing.

Silicon carbide may be made by many different methods resulting in silicon carbides having different and distinct properties such as thermal conductivity, electrical resistivity, density and crystalline structure. Silicon carbide may be single crystal or polycrystalline. Silicon carbides include, but are not limited to, chemical vapor deposited silicon carbide, physical vapor deposited silicon carbide, reaction bonded silicon carbide, sintered silicon carbide, hot pressed silicon carbide and foamed silicon carbide. Typically, the silicon carbide is chosen from CVD silicon carbide, PVD silicon carbide, sintered silicon carbide and hot pressed silicon carbide. More typically, the silicon carbide is chosen from CVD silicon carbide and PVD silicon carbide. Most typically, the silicon carbide is CVD silicon carbide. The CVD silicon carbide typically is β-cubic silicon carbide.

Typically the silicon carbide article is first macroscopically machined. In general, macroscopic machining removes undesired surface features of the silicon carbide articles after they are formed such as, for example, by CVD or PVD, and shapes the articles for their desired functions. Conventional machining process may be used. Such processes include, but are not limited to, grinding, lapping, honing, ultrasonic machining, water jet or abrasive machining, laser machining, electrical discharge machining, ion beam machining, electron beam machining, chemical machining and electrochemical machining. Typically, the surfaces are machined with diamond tooling.

After the silicon carbide articles are macroscopically machined, one or more of their surfaces are further modified to provide silicon carbide articles that generate 160 particles/$dm^2$ or less on semiconductor wafers during semiconductor processing. The methods reduce the crevices and caverns remaining on the surfaces of the silicon carbide articles after macroscopic machining. The reduction of the crevices and caverns reduces the number of loose particle where the particles typically become entrapped. The methods remove much of the loose particles remaining on the articles after macroscopic machining. Post macroscopic machining methods include, but are not limited to, Etching, laser ablation, coatings and using abrasive or grit materials such as in particle blasting, lapping, polishing and ultrasonic machining. Combinations of the methods also may be used to achieve the desired silicon carbide.

Typically the methods modify one or more surfaces of silicon carbide articles to provide one or more surfaces with an Ra of less than or equal to 0.5 microns and an Rz(din) of less than or equal to 5 microns. The roughness of a surface consists of finer irregularities of surface texture and includes Ra and Rz(din). "Ra" refers to the arithmetic average of the absolute values of the profile (peak) height deviations from a mean line recorded within a certain evaluation length (average roughness). Ra ranges from 0.5 microns or less, or such as from 0.1 microns to 0.001 microns, or such as from 0.01 microns to 0.005 microns. Rz(din) value is the average maximum peak-to-valley height of any five consecutive sampling lengths within the measurement length. The peak-to-valley distance is the distance between the height of a surface feature and a trough or valley in the surface. A "peak" is the point of maximum height on a given portion of the profile that lies above a centerline. A "valley" is a point of maximum depth on a given portion or a profile that lies below a centerline. Rz(din) ranges from 5 microns or less, or such as from 1 micron to 0.005 microns, or such as from 0.5 microns to 0.05 microns.

A variety of methods may be used to measure the roughness of a surface. One suitable method is an autocovariance function. The two-dimensional autocovariance function is a function of direction and distance and represents the expected value of the height product of all two-point pairs that are separated by certain length in a direction. In other words, the auto covariance function describes the characteristic feature length, i.e. the length between two peaks having a certain height. For a description of the application of an autocovariance function to the determination of surface topography, see Kiely et al., *Quantification of Topographic Structure by Scanning Probe Microscopy, Journal of Vacuum Sceince Technology B*, vol. 15, no. 4, July/August 1997, pp 1483-1493. Further descriptions of roughness parameters and methods of determining the values of these parameters are provided in Standard ASME B46.1-2002, *Surface texture (Surface Roughness, Wavines and Lay)*, American Society of Mechanical Engineers, 2003. Typically, the directionality surface topography of the surface features are determined using atomic force spectroscopy (AFM) or an optical profilometer.

Any suitable surface etching method may be used as long as the resulting silicon carbide has the desired particle generation. Typically etching is done with molten bases or inorganic acids. Etching with molten bases may be done at temperatures of 500° C. to 1200° C. or such as from 800° C. to 100° C. Etching with acids may be done at temperature of 30° C. to 150° C. or such as from 70° C. to 100° C.

Suitable bases include, but are not limited to, alkali metal bases such as potassium hydroxide, sodium hydroxide, ammonium hydroxide or mixtures thereof. When potassium hydroxide and sodium hydroxide are employed as a mixture, the weight ratio of potassium hydroxide to sodium hydroxide is from 2:1 to 1:2. Typically, etching is done with molten potassium hydroxide. The pH of the molten bases ranges from 8 to 14 or such as from 10 to 13.

The silicon carbide surface may be exposed to the molten base for a period of 5 minutes to 120 minutes or such as from 15 minutes to 60 minutes or such as from 20 minutes to 30 minutes. Exposing silicon carbide to molten base for more than 120 minutes can result in the base corroding the surface and causing more sub-surface damage instead of reducing particle concentration and sub-surface damage.

Molten base treatment is done under atmospheric pressure. Etching may be done in a plasma chamber or any suitable apparatus. The atmosphere under which molten base treatment is done may be an inert atmosphere. Suitable inert gases include, but are not limited to, argon, helium, krypton, xenon, nitrogen, and mixtures thereof. Flow rates of the gases range from 50 slpm to 150 slpm. Hydrogen or hydrogen plus one of the inert gases may be generated in the chamber. Flow rates for hydrogen range from 20 slpm to 150 slpm. A typical inert atmosphere for etching with molten base is argon gas at a flow rate of 70 slpm to 120 slpm and hydrogen at a flow rate of 30 slpm to 75 slpm.

Acid etching also may be done in an inert environment as described for the bases or in a non-inert environment. Acids include, but are not limited to, hydrofluoric acid (HF), nitric acid ($HNO_3$), phosphoric acid ($H_3PO_4$), sulfuric acid ($H_2SO_4$) or mixtures thereof. The concentration of the acids may range from 20% to 90% by weight or such as from 50% to about 80% by weight. Such acid concentrations may be obtained commercially from suppliers or readily prepared by workers. When two or more inorganic acids are mixed together, equal amounts of each acid by weight are used. Typically a mixture of hydrofluoric acid and nitric acid with phosphoric acid in a weight ratio of 2:1:1 or such as 1:2:1 or such as 1:1:2 or such as 1:1:1 is used.

The inorganic acid is applied to the surface of the silicon carbide for 15 minutes to 100 minutes or such as from 30 minutes to about 90 minutes or such as from 50 minutes to 70 minutes.

A more typical etching method with inorganic acids is applying nitric acid at a concentration of 50% to 80% by weight and hydrofluoric acid at a concentration of 20% to 40% by weight to one or more surfaces of silicon carbide for 60 to 90 minutes at a temperature range of 85° C. to 100° C.

Energetic ablation uses radiant energy or beams of electromagnetic waves or particles to modify the silicon carbide surfaces. Radiant energy ablation or heat treating typically is done in a conventional vacuum chamber. A vacuum is slowly created around the article. Pressures may range from $10^{-4}$ to $10^{-10}$ torr, or such as from $10^{-6}$ to $10^{-8}$ torr. Pressure is held constant while the article is then ramped to temperatures of 1000° C. to 2000° C., or such as from 1200° C. to 1500° C. The article is held at a constant temperature and pressure from 2 to 10 hours, or such as from 4 to 8 hours. The article is then slowly cooled and brought to atmospheric pressure and removed from the chamber. Cooling and pressure reduction is done over a period of 5 min to 60 min, or such as from 10 min to 30 min and leaving the ceramic in the chamber to cool to room temperature over 6 hr to 48 hrs, or such as from 12 hr to 24 hr.

Electromagnetic waves or particles include, but are not limited to, protons, neutrons, electrons, X-rays, lasers (high intensity optical radiation), electrical discharge machining (EDM), also known as electrical arc, and microwaves. Apparatus used to modify the surface generally includes a means for controlling and focusing a particular beam of energy onto the surface of the ceramic. The particular means employed to control and focus the beam depends upon the particular type of electromagnetic radiation used. Such apparatus are well known in the art.

In general, where an electromagnetic beam is generated by an electron beam, ion beam or electrical arc an electrical current flows to the article. The current may range from 5 mA to 100 mA, or such as from 10 mA to 80 mA. The energy delivered by the electromagnetic beam may be defined in terms of a power density, which is the average power surface of the ceramic. Average power densities may range from 1000 W/cm$^2$ to 5000 W/cm$^2$, or such as from 2000 W/cm$^2$ to 4000 W/cm$^2$ at a point on the surface of the article upon which the beam is directed. The peak power density of the electromagnetic beam may be from 5000 W/cm$^2$ to 10,000 W/cm$^2$ or such as from 5500 W/cm$^2$ to 8000 W/cm$^2$ as a point on the surface of the ceramic. The peak power density may be defined as a process setting where the bam is at its maximum focus (i.e. smallest spot size) at a given power setting. Dwell times for the electromagnetic beam may range from 0.1 msec to 5 msec, or such as from 0.5 msec to 2 msec.

Any suitable laser may be used to modify silicon carbide surfaces to the desired features. For example carbon dioxide continuous wave lasers, pulsed beam carbon dioxide lasers, yttrium garnet (YAG) lasers, xenon chloride (XeCl) excimer lasers may be used. Laser power densities range from 800 W/cm$^2$ to 2000 W/cm$^2$ or such as from 1000 W/cm$^2$ to 1500 W/cm$^2$. Typically, laser ablation removes from 0.01 to 5 microns from the surface or such as from 0.1 microns to 3 microns or such as from 1 to 2 microns of silicon carbide from the surface.

Surface oxidation includes placing the silicon carbide article in a conventional open air furnace at temperatures of 800° C. to 2000° C. or such as from 1000° C. to 1500° C. Heating continues for 50 hr to 400 hr, or such as from 100 hr to 250 hr. To expedite the process additional oxygen may be pumped into the furnace. Optionally, steam also may be included with the air during oxidation to expedite the oxidation process. When steam is included with the air, typically, steam ranges from 5% to 20% by volume and oxygen ranges from 95% to 80% by volume of the mixture.

Alternatively, the method may be done in a closed furnace with oxygen pumped into the furnace. Typically pressures in a closed furnace range from 50 torr to 1 atmosphere. Oxidation in closed furnaces typically takes from 5 hr to 30 hr, or such as from 10 hr to 20 hr.

The oxide layer may range in thickness from 0.1 microns to 10 microns or such as from 0.2 microns to 5 microns or such as from 0.3 microns to 2 microns. Typically the oxide is silicon oxide, silicon dioxide or a combination of silicon oxide and silicon dioxide composing the oxide layer. The oxide layer is then stripped off using one or more inorganic acids. Suitable acids include, but are not limited to, hydrochloric acid, sulfuric acid, nitric acid, hydrofluoric acid, phosphoric acid and mixtures thereof. Typically hydrofluoric acid is used. Stripping is done at temperatures of 20° C. to 90° C.

When the oxide is removed, rough surface features and sharp peaks which the oxide coats, are removed as well. Crevices and caverns which may entrap silicon carbide particles are reduced. Removal of the oxide layer provides a smooth surface having desired surface features.

Lapping and polishing may be done using conventional apparatus, such as with various lapping apparatus and polishing pads. When lapping plates are used, the plates turn at surface speeds of 300 m/min to 3000 m/min or such as from 600 m/min to 2500 m/min. Lapping and polishing are done at pressures of 1 psi to 15 psi, or such as from 1 hr to 10 hrs.

Lapping and polishing may be done with slurries, pastes and dry particles. Various types of particles may be used as well as particle sizes. Lapping and polishing may be done in multiple steps of varying particle sizes to achieve the desired surface roughness.

Chemical mechanical polishing may be done with particles having the formula $AO.xZ_2O_3$, wherein A is at least one divalent cation, Z is at least one trivalent cation and $0.01 \leq x \leq 100$. Cations include, but are not limited to, magnesium, iron (II), zinc, manganese, nickel, calcium and mixtures thereof. Z cations include, but are not limited to, aluminum, iron (III), chromium, titanium and mixtures thereof. Such particles have a specific area of 5 m$^2$/g to 200 m$^2$/g and a mean crystalline diameter of 5 nm to 500 nm and a mean aggregate particle diameter of 10 nm to 5000 nm. The Zeta potential may be positive, zero or negative. Typically the Zeta potential of the slurries are greater than or equal to +10 mV or less than or equal to −10 mV. The aqueous slurry includes particles in amounts of 0.1 wt % to 10 wt %. In addition to the particles, the slurry also may include oxidizing and reducing agents such as hydroxylamine compounds ammonium persulfate, hydrogen peroxide, polyelectrolytes and organic acids. Chelating agents as well as surfactants, stabilizers, suspending agents, buffers and lubricants also may be included. Additional cations also may be included such as, but not limited to, zirconium, copper, cobalt, lithium and rare earth cations.

Other abrasive particles which may be used include, but are not limited to, diamond, boron carbide, boron nitride, carbon nitride, silicon carbide, silicon nitride and mixtures thereof. Particle sizes may range from 0.005 microns to 30 microns, or such as from 0.05 microns to 20 microns, or such as from 0.5 microns to 10 microns. When diamond paste is used the particles sizes may range from 2 microns or less, typically 1 micron or less. Such abrasive particles may compose 1 wt % to 30 wt % of slurries. Conventional additives such as chelating agents, buffers and surfactants may be included in the slurries in conventional amounts.

Other forms of abrasive treatment include, but are not limited to, fixed abrasive grinding and grit blasting, such as sand blasting. Fixed abrasive grinding typically involves using diamond, silicon carbide and other abrasives which have a Mohs hardness of 9 and higher. Combinations of such materials also may be used. The abrasive may be in particle form or in the form of a grinding wheel such as a diamond wheel. The surface speed of the wheel is at least 1000 m/min., or such as from 2000 m/min to 10,000 m/min. Particles are applied at pressures of 10 psi to 100 psi, or such as from 20 psi to 80 psi. Conventional grinding apparatus may be used.

When grit blasting is used, conventional sand blasting apparatus, particle blast apparatus and blast cabinets may be used. Abrasives include, but are not limited to, diamond, silicon carbide, silicon nitride, boron nitride, boron carbide and combinations thereof. Abrasives are applied to the surface of the articles at pressures of 10 psi to 500 psi, or such as from 25 psi to 150 psi. Such pressures are applied until the desired surface is obtained.

Ultrasound may be used along with abrasive particles. Ultrasonic tools have a frame adapted to hold a work piece and a tool holder including an ultrasonic driver that vibrates the tool at frequencies such as from 15 KHz to 40 KHz or such as from 20 KHz to 35 KHz. Ultrasonic etching ranges from 30 minutes to 120 minutes or such as from 60 minutes to 90 minutes.

Coatings of materials also may be used to provide the desired surfaces. Such coatings include, but are not limited to, silicon carbide, silicon, silicon nitride, silicon dioxide and carbon. Such coatings may be deposited on the ceramic article surfaces by CVD or PVD. Conventional reactants may be used to form the coatings. Deposition temperatures and pressures may vary depending on the type of coating. Typically, furnace temperatures may range from 1000° C. to 1500° C., or such as from 1200° C. to 1400° C. Furnace pressures may range from 20 torr to 760 torr, or such as from 80 torr to 125 torr. Coating deposition rates may range from 0.01 microns/min to 5 microns/min or such as from 0.5 microns/min to 3 microns/min. Generally, coating thicknesses may range from 0.01 microns to 10 microns, or such as from 0.1 microns to 5 microns.

After modifying the surfaces of silicon carbide articles, optionally, the silicon carbide surfaces may be further treated to remove any remaining residue on the surfaces. Such optional treatments include, but are not limited to, treating with dilute inorganic or organic acids or supercritical carbon dioxide.

Suitable acids include, but are not limited to, dilute aqueous solutions of hydrochloric acid, sulfuric acid, nitric acid, hydrofluoric acid, phosphoric acid, acetic acid and mixtures thereof. Such acids are typically used at concentrations of 0.5 wt % to 10 wt %.

Silicon carbide articles may be treated with supercritical carbon dioxide in high pressure reactors. Supercritical carbon dioxide may readily penetrate crevices or caverns in the silicon carbide articles to remove loose particle which may accumulate in the crevices and caverns. The articles are pressurized at pressures of 70 atmospheres to 250 atmospheres or such as from 100 atmospheres to 200 atmospheres.

The silicon carbide surfaces typically have an RMS of from 10 Å to 100 Å or such as from 20 Å to 60 Å using a Talystep mechanical contact profilometer. The silicon carbide surfaces may be inspected for desired particle concentrations and subsurface finish using SEMs.

Typically, the semiconductor wafers are composed of materials which include, but are not limited to, silicon, sapphire, gallium arsenic, or silicon carbide. More typically, the semiconductor wafers are composed of silicon. One or more wafers may be processed simultaneously.

The silicon carbide articles may be used in various wafer processing apparatus. Such articles include, but are not limited to, plasma screens, gas diffusion plates, focus rings, susceptor rings and wafer holding apparatus in general. Processing apparatus include, but are not limited to, batch processing chambers such as for high temperature annealing of wafers, rapid thermal annealing (RTA) furnaces, high temperature diffusion, nitride deposition, single wafer processing chambers such as for epitaxial silicon growth, chemical vapor deposition film growth, wafer annealing, high temperature diffusion and plasma etch chambers.

The following examples further illustrate the invention, but are not intended to limit the scope of the invention.

EXAMPLE 1

A CVD silicon carbide susceptor ring is machined to a surface roughness of Ra=0.8 microns using a conventional grinding apparatus. The surface roughness is measured using a contact profilometer. The machining is done with a diamond wheel initially having a 150 grit followed by a diamond wheel having a 320 grit. Grinding is done at a rate of 1750 rpm for 9 hours.

The susceptor ring is then lapped using a Pellon Pad™ lapping pad using diamond paste with a particle size of 4 microns to 8 microns. Lapping is done for 2 hours at a surface speed of 600 m/min.

The surface roughness is measured using a contact profilometer. The Ra value is determined to be 0.1 microns and the Rz(din) is determined to be 1 micron.

The susceptor ring is then placed in a wafer boat and a semiconductor wafer is placed in the susceptor ring. The wafer boat is then placed in a conventional CVD furnace. The furnace is heated to a temperature of 1100° C. and an inert argon and hydrogen atmosphere is created as for epitaxial film formation. The wafer boat with the wafer is heated in the furnace for 6 hrs. The furnace is then cooled to room temperature, and the wafer boat with the susceptor ring and the wafer are removed from the furnace. The number of silicon carbide particles on the wafer is expected to be less than 160 particles/dm$^2$.

EXAMPLE 2

A CVD silicon carbide susceptor ring is machined to a surface roughness of Ra=0.8 microns using a conventional grinding apparatus and method as described in Example 1. The surface roughness is measured using a contact profilometer.

The susceptor ring is then lapped using a Pellon Pad™ lapping pad using diamond paste with a particle size of 4 microns to 8 microns. Lapping was done for 2 hours at a surface speed of 1200 m/min. The susceptor is then polished for 3 hours using a diamond paste having a particle size of 2 microns to 4 microns. The Ra is expected to be less than 0.05 microns and the Rz(din) is expected to be less than 0.5 microns, as measured with a contact profilometer.

The susceptor ring is then placed in a wafer holding apparatus and a semiconductor wafer is placed in the susceptor ring. The apparatus is then placed into a CVD furnace with an inert argon atmosphere. The temperature of the furnace is raised from room temperature to 1100° C. The apparatus is heated in the furnace for 10 hrs. The furnace is then cooled to room temperature. When the wafer holding apparatus reaches room temperature, it is removed from the furnace. The silicon wafer is removed from the apparatus. The number of silicon carbide particles on the wafer is expected to be less than 160 particles/dm$^2$.

EXAMPLE 3

A CVD silicon carbide susceptor ring is machined to a surface roughness of Ra=0.8 microns using a conventional grinding apparatus as described in Example 1. The surface roughness is measured using a contact profilometer.

The susceptor ring is then lapped using a Pellon Pad™ lapping pad using diamond paste with a particle size of 0.25 microns to 1 micron. Lapping is done for 3 hours at a surface speed of 1500 m/min. The susceptor is then polished for 4 hours using a diamond paste with particles having a size range of 0.25 microns to 1 micron. The Ra is expected to be 0.005 microns and the Rz(din) is expected to be 0.05 microns.

The susceptor ring is then placed in a standard thermal open air furnace at 1100° C. for 100 hours to produce a 0.4 microns thick layer of silicon dioxide over the ring's surface. The temperature is then cooled to ambient temperature. When the susceptor ring is cooled, it is immersed in 1N hydrofluoric acid solution for 30 minutes at 30° C. to strip the silicon dioxide layer from the susceptor.

The susceptor is then placed in a wafer boat. A silicon semiconductor wafer is placed in the susceptor boat, and the boat is then placed in a furnace. The furnace is provided with an inert atmosphere of argon and hydrogen. The furnace is heated to 1200° C. and the boat remains in the furnace for 10 hours. The temperature of the furnace is allowed to cool to

EXAMPLE 4

A CVD silicon carbide susceptor ring is machined according the same procedure as in Example 1 to achieve a Ra=0.8. The susceptor is then placed into a standard thermal open air furnace containing 20% oxygen. The temperature of the furnace is raised to 1000° C. and the pressure is maintained at 1 atmosphere. The susceptor is heated in the furnace for 12 hours to produce a silicon dioxide layer on the surface of the susceptor 0.1 microns thick.

The susceptor is then placed in a wafer boat. A semiconductor wafer is placed in the susceptor and the boat is then placed into a furnace with an inert argon and hydrogen atmosphere. The furnace is heated to 1200° C. The boat is heated in the furnace for 10 hours. The temperature of the furnace is then allowed to cool to room temperature. The number of particles on the wafer is expected to be less than 65 particles/$dm^2$.

EXAMPLE 5

A CVD silicon carbide susceptor ring is machined to a Ra=0.8 as described in Example 1. The susceptor ring is then placed in a standard thermal open air furnace to produce a 0.8 microns thick layer of silicon dioxide over the ring's surface.

The temperature of the open air furnace is maintained at 1100° C. for 200 hrs to produce the silicon dioxide layer over the surface of the susceptor ring. The furnace is then cooled to ambient temperature. When the sesceptor ring cools, it is immersed in a 1N hydrofluoric acid solution for 30 min at 30° C. to strip the silicon dioxide layer from the susceptor.

The surface roughness of the susceptor is measured with a contact profilometer. The Ra is measured to be 0.1 microns and the Rz is measured to be 1 micron.

The susceptor ring is placed in a wafer boat and a silicon semiconductor wafer is placed in the ring. The boat is then placed into a furnace and heated to a temperature of 1050° C. The boat is left in the furnace for 5.5 hrs in an atmosphere of argon and hydrogen. After 5.5 hours the furnace is cooled to room temperature. When the boat reaches room temperature, it is removed from the furnace. The wafer is expected to have less than 160 partilces/$dm^2$.

EXAMPLE 6

A chemical vapor deposited silicon carbide susceptor ring is machined to a Ra=0.8 as described in Example 1. The susceptor ring is then placed in a standard thermal open air furnace to produce a 1 micron thick layer of silicon dioxide over the ring's surface.

The temperature of the open air furnace is maintained at 1100° C. for 300 hours to produce a silicon dioxide layer over the surface of the susceptor ring. The furnace is then cooled to ambient temperature. The silicon dioxide coated ring is then immersed into a solution of 1N hydrofluoric acid solution for 30 minutes at 30° C. to strip the silicon dioxide layer from the ring.

The susceptor is then placed in a wafer boat. A silicon semiconductor wafer is placed in the boat and the boat is placed in a furnace. The furnace is heated to 1200° C. and the boat remains in the furnace for 10 hours. When the furnace cools, the boat is removed along with the wafer. The number of particles on the wafer is expected to be less than 65 particles/$dm^2$.

EXAMPLE 7

A chemical vapor deposited silicon carbide gas diffusion plate is mechanically polished using diamond particles of 0.25 microns to 1 micron to an RMS of 20 Å. The surface is measured on a Talystep mechanical contact profilometer. The polished gas diffusion plate is then etched on its surface using molten potassium hydroxide at 900° C. for 10 minutes. Etching is done in an inert argon gas atmosphere.

The gas diffusion plate is then placed in a high pressure reactor and pressurized to 200 atmospheres with supercritical carbon dioxide. The gas diffusion plate is maintained in the reactor for 5 hours. When the gas diffusion plate is examined with SEM, few if any particles are expected to be seen on the plate.

EXAMPLE 8

A chemical vapor deposited silicon carbide gas diffusion plate is etched with 50 wt % nitric acid and 20 wt % hydrofluoric acid at 20° C. for 60 minutes. The gas diffusion plate is rinsed with distilled water to remove any excess nitric acid. The gas diffusion plate is then placed in a high pressure reactor as in Example 7 and treated with supercritical carbon dioxide. Few if any particles are expected to be seen on the surfaces of the gas diffusion plate with an SEM analysis.

EXAMPLE 9

A silicon carbide gas diffusion plate is wet sand blasted using alumina abrasive particles. The alumina abrasive particles are from 10 microns to 20 microns in size. Surfaces of the gas diffusion plate are blasted for 30 minutes as a slurry flow rate of 10 ml/minute.

After the sand blasting is completed, the gas diffusion plate is removed from the blasting chamber and placed in a high pressure reactor as in Example 7 and treated with surpercritical carbon dioxide. When the gas diffusion plate is examined with SEM, few if any particles are expected to be seen.

EXAMPLE 10

A chemical vapor deposited silicon carbide gas diffusion plate is machined to a Ra=0.8 as described in Example 1. The gas diffusion plate is then placed in a standard thermal open air furnace and steam is added to produce a 1 micron thick layer of silicon dioxide over the plate's surface.

The temperature of the open air furnace is maintained at 1100° C. for 50 hours. Steam is mixed with the air such that the air composes 90% by volume and the steam composes 10% by volume of the mixture. The furnace is then cooled to ambient temperature. The silicon dioxide coated plate is then immersed into a solution of 1 N hydrofluoric acid solution for 30 minutes at 30° C. to strip the silicon dioxide layer from the plate. When the gas diffusion plate is examined with SEM, few if any particles are expected to be seen on the plate.

What is claimed is:

1. A method comprising:
   a) providing a silicon carbide article; and
   b) modifying one or more surfaces of the silicon carbide article by oxidizing to form a coating on the one or more surfaces followed by stripping the coating from the one or more surfaces such that the one or more surfaces of the article have an Ra of less than or equal to 0.5 microns and an Rz(din) of less than or equal to 5 microns and the article generates 160 particles/$dinz$ or less on a semiconductor wafer during wafer processing.

2. The method of claim 1, further comprising the step of treating the silicon carbide article with supercritical carbon dioxide.

3. The method of claim 1, wherein the silicon carbide is chosen from CVD silicon carbide, PVD silicon carbide, reaction bonded silicon carbide, sintered silicon carbide, hot pressed silicon carbide or foamed silicon carbide.

4. The method of claim 1 wherein the Oxide coating is stripped with one or more inorganic acids.

5. The method of claim 1 wherein the oxide coating is 0.1 microns to 10 microns thick.

6. The method of claim 1, wherein the one or more surfaces of the article have an Ra of 0.1 microns to 0.001 microns.

7. The method of claim 1, wherein the one or more surfaces of the article have an Rz(din) of 1 micron to 0.005 microns.

* * * * *

UNITED STATES PATENT AND TRADEMARK OFFICE
CERTIFICATE OF CORRECTION

PATENT NO. : 7,589,025 B2 Page 1 of 1
APPLICATION NO. : 11/607632
DATED : September 15, 2009
INVENTOR(S) : Jitendra S. Goela et al.

It is certified that error appears in the above-identified patent and that said Letters Patent is hereby corrected as shown below:

In claim 1 (col. 10, line 66), "160 particles/dinz"" should be changed to --160 particles/$dm^2$--

Signed and Sealed this

Eighteenth Day of May, 2010

David J. Kappos
*Director of the United States Patent and Trademark Office*